United States Patent
Mitsui et al.

(10) Patent No.: US 6,639,318 B1
(45) Date of Patent: Oct. 28, 2003

(54) INTEGRATED CIRCUIT DEVICE AND ITS MANUFACTURING METHOD

(75) Inventors: Akira Mitsui, Yokohama (JP); Atsushi Hayashi, Tokyo (JP); Kiyoshi Matsumoto, Yokohama (JP); Hiromichi Nishimura, Yokohama (JP); Yasuhiro Sanada, Yokohama (JP); Makoto Noshiro, Chigasaki (JP); Kazuo Sunahara, Chigasaki (JP)

(73) Assignees: Asahi Glass Company, Limited, Tokyo (JP); Seimi Chemical Co., Ltd., Chigasaki (JP)

( * ) Notice: Subject to any disclaimer, the term of this patent is extended or adjusted under 35 U.S.C. 154(b) by 0 days.

(21) Appl. No.: 09/647,917

(22) PCT Filed: Feb. 15, 2000

(86) PCT No.: PCT/JP00/00831
§ 371 (c)(1),
(2), (4) Date: Oct. 13, 2000

(87) PCT Pub. No.: WO00/48241
PCT Pub. Date: Aug. 17, 2000

(30) Foreign Application Priority Data

Feb. 15, 1999 (JP) ............................................. 11-036373
Feb. 15, 1999 (JP) ............................................. 11-036374

(51) Int. Cl.[7] .............................................. H01L 29/40
(52) U.S. Cl. ........................ 257/751; 257/750; 438/627
(58) Field of Search ................................. 257/751, 750; 438/639, 622, 623, 637, 631, 627

(56) References Cited

U.S. PATENT DOCUMENTS

| | | | |
|---|---|---|---|
| 5,296,653 A | 3/1994 | Kiyota et al. | |
| 5,712,509 A | 1/1998 | Harada et al. | |
| 6,372,632 B1 * | 4/2002 | Yu et al. | 438/634 |

FOREIGN PATENT DOCUMENTS

| | | |
|---|---|---|
| JP | 3-35524 | 2/1991 |
| JP | 10-209156 | 8/1998 |
| JP | 2000-49116 | 2/2000 |

OTHER PUBLICATIONS

M. Stavrev, et al., Microelectronic Engineering, vol. 37–38, pps. 245–251, "Study of Ta(N,O) Diffusion Barrier Stability: Analytical and Electrical Characterization of Low Level Cu Contamination in Si," Nov. 1, 1997.

M. Stavrev, et al., Thin Solid Films, vol. 307, No. 1–2, pps. 79–88, "Crystallographic and Morphological Characterization of Reactively Sputtered Ta, Ta–N and Ta–N and Ta–N–O Thin Films," Oct. 10, 1997.

M. Stavrev, et al., Materials for Advanced Metallization, pps. 125–126, "Ultra Trace Analysis and Electrical Characterization of Cu Diffusion Through Thin Quasi–Amorphous Ta–N–O Barriers," Mar. 16, 1997.

Stavrev et al. "Study of Ta(N,O) diffusion barrier stability: analytic and electrical characterization of low level Cu contamination in Si" Microelectronic Engineering Elsevier Publishers BV Amsterfam, NL, vol. 37–38 Nov. 1, 1997, pp. 245–251.*

* cited by examiner

Primary Examiner—Roy Potter
(74) Attorney, Agent, or Firm—Oblon, Spivak, McClelland, Maier & Neustadt, P.C.

(57) ABSTRACT

The present invention has an object to provide an integrated circuit device having a Cu wiring, using a barrier layer which facilitates planarization. The present invention relates to an integrated circuit device having a Cu wiring layer, a barrier layer therefor and a dielectric layer, wherein the barrier layer is represented by a compositional formula of $TaO_xN_y$ (the range of x being $0<x<2.5$, and the range of y being $0<y<1$). Further, the present invention relates to an integrated circuit device having a Cu wiring layer, a barrier layer therefor and a dielectric layer, wherein the barrier layer is represented by a compositional formula of $Ta_{1-a}M_aO_bN_c$ (M being at least one member selected from the group consisting of elements of Groups 3, 4, 6, 7, 8, 9, 10, 12, 13 and 14 of the long form of the periodic table, the range of a being $0<a<1$, the range of b being $0<b<2.5$, and the range of c being $0<c<1$).

8 Claims, 1 Drawing Sheet

INTEGRATED CIRCUIT DEVICE AND ITS MANUFACTURING METHOD

TECHNICAL FIELD

The present invention relates to an integrated circuit device having a Cu wiring and a method for producing the same.

BACKGROUND ART

There are requirements of refinement and high-speed response to integrated circuit devices. To satisfy such requirements, it is noted to use Cu, as material for wiring, which has a low resistance and a little electro-migration, instead of conventionally used Al. However, when Cu is used as the material for wiring, there is a problem of diffusion of Cu into a Si substrate or a dielectric layer. In order to prevent this problem, it is necessary to form a barrier layer between a Cu wiring layer and the Si substrate or the dielectric layer. The barrier layer is required to have high adhesive properties to Cu and the dielectric layer or the like as well as the capability of preventing the diffusion of Cu.

At present, Ti, TiN, Ta, TaN and WN are proposed as a barrier in a Cu wiring. In particular, Ta and TaN are noted by the reasons that they have a good barrier effect to Cu; they can easily be formed into a thin layer, and the adhesive properties to Cu, the dielectric layer and so on are excellent (U.S. Pat. No. 5,668,054).

Further, in a process for producing an integrated circuit device, a chemical-mechanical polishing (CMP) method is used to planarize each layer in order to form a large number of multilayer wiring. In CMP method for planarizing, however, Ta or TaN for a barrier layer has its nature of being hard mechanically and anti-corrosive to chemicals in comparison with Cu and the dielectric layer. Accordingly, it was difficult to process Cu and the dielectric layer together with the barrier layer by CMP method. If the processing was conducted to those simultaneously, there caused a phenomenon, called as dishing, that only Cu and the dielectric layer are recessed in a form of dish owing to the difference of characteristics of processing.

As a barrier layer different from the above-mentioned, Ti—Si—N series (JP-A-8-139092) and W—Si—N series (JP-A-9-64044) were proposed. However, they did not aim at improving the processing characteristics in using CMP method. Further, there was a proposal that TaON was provided in only a surface of the TaN barrier layer (JP-A-10-116831). However, this did not aim at improving the processing characteristics in using CMP method, and it was necessary to process the material, which is difficult to process, after TaON in the surface portion was removed.

DISCLOSURE OF THE INVENTION

The present invention is to provide an integrated circuit device having a Cu wiring layer, a barrier layer therefore and a dielectric layer, wherein the barrier layer is represented by a compositional formula of $TaO_xN_y$ (the range of x being 0<x<2.5, and the range of y being 0<y<1).

Further, the present invention is to provide an integrated circuit device having a Cu wiring layer, a barrier layer therefore and a dielectric layer, wherein the barrier layer is represented by a compositional formula of $Ta_{1-a}M_aO_bN_c$ (M being at least one member selected from the group consisting of elements of Groups 3, 4, 6, 7, 8, 9, 10, 12, 13 and 14 of the long form of the periodic table; the range of a being 0<a<1; the range of b being 0<b<2.5, and the range of c being 0<c<1).

BEST MODE FOR CARRYING OUT THE INVENTION

Figure 1:
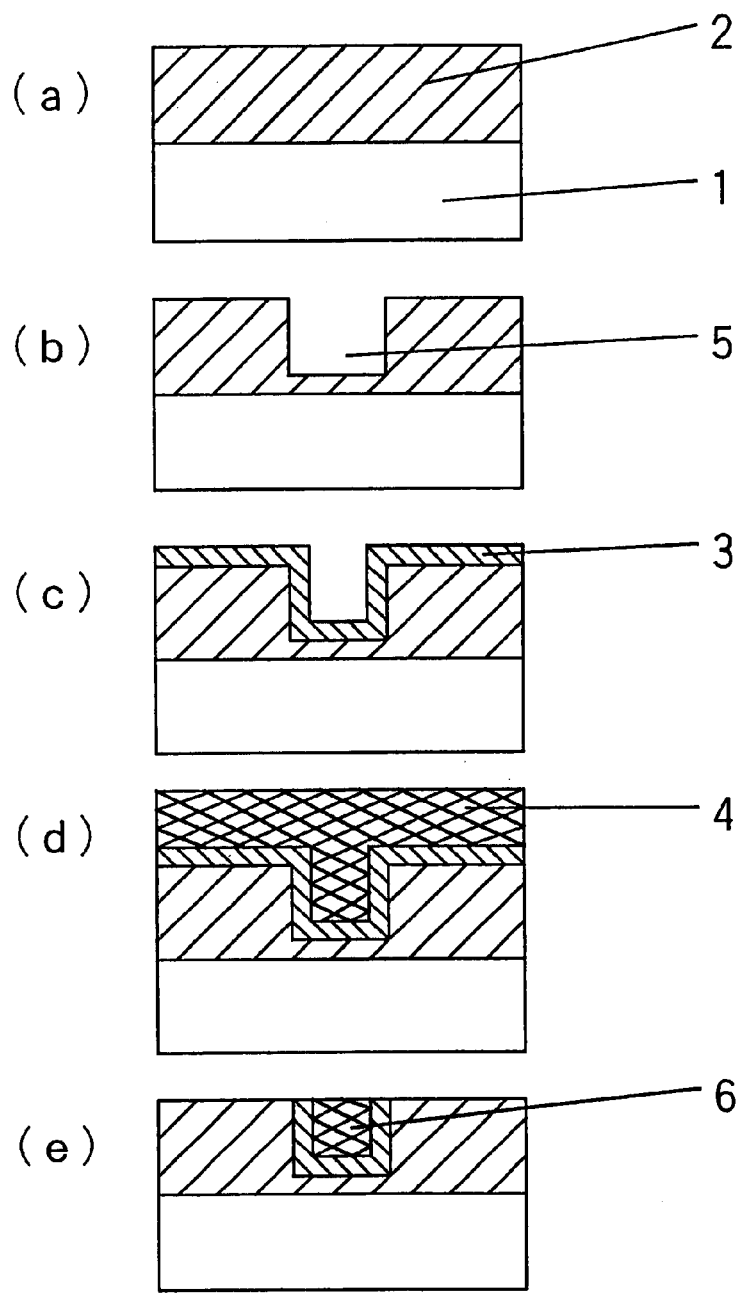
FIG. 1 is a cross-sectional view showing an example of the process for producing the integrated circuit device of the present invention, wherein numeral 1: a Si substrate, 2: a dielectric layer, 3: a barrier layer, 4: Cu. And 5: a groove.

The barrier layer of $TaO_xN_y$ (hereinbelow, referred to as compositional formula 1) of the present invention is controllable to the extent that it can be processed, regardless of its having mechanical hardness and chemical corrosion properties, without reducing adhesive properties in comparison with the conventionally used barrier layer of Ta or TaN while the performance of the integrated circuit device is not substantially reduced.

Although the range of x and y of $TaO_xN_y$ can be 0<x<2.5 and 0<y<1, it is further desirable to be $0.001 \leq x<0.2$ and $0.001 \leq y<0.5$. This is because there may be influence by an increased resistance of the wiring since a reduction of the electric conductivity is remarkable when $x \geq 0.2$ or $y \geq 0.5$. Further, a value of 0.001 or less does not provide a clear effect because an amount of addition is too small. It is further desirable that $0.001 \leq x<0.1$ and $0.001 \leq y<0.3$ because the electric conductivity is improved and a reduction of the forming rate of the $TaO_xN_y$ layer can be suppressed.

The range of x and y of $TaO_xN_y$ is preferably x<y because nitrogen in a Ta layer can suppress the reduction of electric conductivity in comparison with oxygen in that layer, and reduction in the forming rate, when such layer is formed, is suppressed. Further, it is preferable that x+y<0.5. The reasons are that when each amount of oxygen and nitrogen in Ta is increased, the electric conductivity of the layer is reduced; the forming rate of the layer is reduced, and an inner stress of the layer is increased whereby the layer is apt to peel off.

As M of the barrier layer of $Ta_{1-a}M_aO_bN_c$ (hereinbelow, referred to as compositional formula 2) according to the present invention, there are following as preferred elements.

Elements of Group 3: Sc, Y, La, Ce, Pr, Nd, Pm, Sm, Eu, Gd, Tb, Dy, Ho, Er, Tm, Yb and Lu.
Elements of Group 4: Ti, Zr and Hf.
Elements of Group 6: Cr, Mo and W.
Elements of Group 7: Mn and Re.
Elements of Group 8: Fe, Ru and Os.
Elements of Group 9: Co, Rh and Ir.
Elements of Group 10: Ni, Pd and Pt.
Elements of Group 12: Zn, Cd and Hg.
Elements of Group 13: Al, Ga, In and Tl.
Elements of Group 14: Si, Ge, Sn and Pb.

These elements can have, under control, Ta or TaN having the above-mentioned properties of mechanical hardness and chemical corrosion processed easily without reducing substantially its adhesive properties and without reducing substantially the performance of the integrated circuit device. The metallic elements of Groups 1, 2 and 11 can not provide a highly reliable integrated circuit device because the performance of the device is substantially reduced by the diffusion of these elements. The elements of Group 5 can not control Ta or TaN having the properties of mechanical hardness and chemical corrosion so as to be easily processed.

For M of the barrier layer comprising $Ta_{1-a}M_aO_bN_c$ according to the present invention, use of at least one member selected from the group consisting of Al, Ti, Si, W, Mo and Zn is preferable from the viewpoints of the performance of the integrated circuit device, the adhesive properties and being easily processed.

Further, the range of a in $Ta_{1-a}M_aO_bN_c$ is preferably $0.001 \leq a \leq 0.9$ from the viewpoints of the performance of the integrated circuit device, the adhesive properties and being easily processed. When at least two elements are used for M, the total amount of them should be within the above-mentioned range. When $a>0.9$, a sufficient effect as a barrier and sufficient adhesive properties can not be expected.

Although the range of b and c in $Ta_{1-a}M_aO_bN_c$ can be $0<b<2.5$ and $0<c<1$, it is further preferable that $0.001 \leq b<0.2$ and $0.001 \leq c<0.5$. It is because when $b \geq 0.2$ or $c \geq 0.5$, reduction in the electric conductivity is substantial and there may be influence by an increased resistance of the wire. Further, a value of 0.001 or less can not provide a clear effect because an amount of addition is too small. Further, it is preferable that $0.001 \leq b<0.1$ and $0.00 \leq c<0.3$ because the electric conductivity is improved and reduction of the forming rate of the $Ta_{1-a}M_aO_bN_c$ layer can be suppressed.

The range of b and c in $Ta_{1-a}M_aO_bN_c$ is preferably $b<c$ because nitrogen in a Ta layer can suppress the reduction of electric conductivity in comparison with oxygen in that layer, and reduction of the forming rate of the layer, when such layer is formed, is suppressed. Further, it is preferable that $b+c<0.5$. It is because when each amount of oxygen and nitrogen in Ta is increased, the electric conductivity of the layer is reduced; the forming rate of the layer is reduced, and an inner stress of the layer is increased whereby the layer is apt to peel off.

As the method for forming the barrier layer in the present invention, there is a method of sputtering with a target comprising Ta, or an alloy or a mixture of Ta and M.

In forming the $TaO_xN_y$ barrier layer, it is preferable to use a metal of Ta as a target and to use a gas mixture comprising oxygen and nitrogen as sputtering gas. As the method for forming the $Ta_{1-a}M_aO_bN_c$ barrier layer, there is a method wherein a mixture (including an alloy) of Ta and M is previously used as a target and a layer is formed by sputtering the target, or there is a method wherein a target is comprised of a combination of Ta and an additive metal in a mosaic form and the target is sputtered. In each of these methods, adjustment of x and y is made by changing the proportion of the gas mixture. The volumetric ratio of oxygen and nitrogen in the gas mixture is preferably in a range of 1:99–50:50. When the gas mixture further includes argon, an amount of x and y in the $TaO_xN_y$ layer can be preferably reduced. In this case, it is preferable that the volumetric ratio of argon to the total amount of oxygen and nitrogen is 0.001:1–1:1. Further, carbon dioxide can be used for oxygen. Since the oxidation of carbon dioxide is weaker than oxygen, it is effective when a layer including a small amount of oxygen is produced with good reproducibility.

In the integrated circuit device of the present invention, it is preferable that the thickness of the barrier layer is 1–200 nm, more preferably, 10–100 nm. It is preferable that the barrier layer, in its substantially entire portion in a direction of the thickness, is represented by the compositional formula 1 or the compositional formula 2.

In producing the integrated circuit device, it is preferable to conduct the following steps A–E in this order.

(A) A step of forming a dielectric layer on a Si substrate,
(B) A step of forming a groove in the dielectric layer,
(C) A step of forming a barrier layer on the dielectric layer by sputtering in the presence of a gas comprising oxygen and nitrogen, using a target comprising Ta or Ta and M (M being at least one member selected from the group consisting of elements of Groups 3, 4, 6, 7, 8, 9, 10, 12, 13 and 14 of the long form of the periodic table),
(D) A step of arranging a Cu wire on the barrier layer, and
(E) A step of removing the barrier layer to layer the Cu wire.

A specific example of the method for producing the integrated circuit device is shown in FIG. 1. In FIG. 1, the production is achieved through the following steps.

(a) On a Si substrate 1, a $SiO_2$ dielectric layer 2 of 500 nm is formed with use of CVD method or the like.
(b) A groove 5 is patterned in the $SiO_2$ dielectric layer 2 by RIE (reactive ion etching) method or the like.
(c) A barrier layer 3 according to the present invention is formed to have a thickness of 50 nm by a sputtering method.
(d) A Cu layer 4 is formed on a surface of the barrier layer to have a thickness of 500 nm.
(e) The layer is planarized by CMP method or the like to form a damascened wire 6 of Cu.

As another method for producing the semiconductor device of the present invention, a sputtering method using a target comprising an oxide or a nitride of Ta, or a reactive sputtering method, or a vapor deposition method such as CVD method or PVD method may be employed.

Now, the present invention will be described with reference to Examples. However, the present invention is not limited thereto.

EXAMPLES 1–8

As shown in FIG. 1(a), a $SiO_2$ dielectric layer 2 of 500 nm thick was formed on a Si substrate 1 by P-TEOS (a plasma CVD using hydrolysis of tetraethylorthosilicate). Then, as shown in FIG. 1(b), a groove 5 was patterned in the $SiO_2$ dielectric layer 2 by RIE method. Thereafter, a barrier layer 3 was formed to have a thickness of 50 nm by RF sputtering method as shown in FIG. 1(c). In all the cases, Ta was used for the target. The sputtering gas was introduced with respective composition (volume %) of oxygen and nitrogen as shown in Table 1. The sputtering gas pressure was 267 Pa.

Further, a Cu layer 4 of 500 nm thick was formed on a surface of the barrier layer by DC sputtering method as shown in FIG. 1(d). Then, a planarization was conducted with CMP method to form a damascened wire 6 of Cu as shown in FIG. 1(e). An abrasive material used in CMP method was composed of a 2% aqueous slurry of alumina of an average particle diameter of 0.2 um having 1% ammonium fluoride incorporated.

On integrated circuit devices (Examples 1–8) produced by the method using RF sputtering and sputtering gas having different compositions, the flatness of the surface of the devices after the above-mentioned CMP process and the barrier effect of the barrier layer to Cu were measured. Table 1 shows a result. Examples 1–6 are examples according to the present invention wherein the barrier layers represented by the compositional formula 1 were formed, and Examples 7 and 8 are comparative examples.

[Flatness]

The flatness is shown by a state of dishing. A case without dishing is indicated by A; a case that there is dishing but the degree of dishing is slight and there is an improvement more than that of the conventional case is indicated by B and a case that dishing is serious is indicated by C.

[Barrier Effect]

The barrier effect was measured by heating the integrated circuit devices at 600° C. in hydrogen for 1 hour and thereafter, by taking a profile for comparison by SIMS. A case equivalent to the case that a TaN layer is used for the barrier layer (Example 7) is indicated by A; a case of inferior but being sufficient for use is indicated by B, and a case of inferior is indicated by C.

TABLE 1

| Examples | Composition of sputtering gas | | Flatness | Barrier effect |
|---|---|---|---|---|
| | Oxygen | Nitrogen | | |
| 1 | 1 | 99 | A | A |
| 2 | 5 | 95 | A | A |
| 3 | 10 | 90 | A | A |
| 4 | 20 | 80 | A | A |
| 5 | 30 | 70 | A | A |
| 6 | 40 | 60 | A | A |
| 7 | 0 | 100 | C | A |
| 8 | 100 | 0 | C | B |

As described above, an integrated circuit device having a high barrier effect and a high flatness without dishing can be produced by using the barrier layer of the present invention.

EXAMPLES 9–14

Integrated circuit devices having a damascened wiring of Cu were produced in the same manner as in Examples 1–8 except that the compositions as in Table 2 were used for sputtering gas in forming each barrier layer 3. A sputtering gas pressure was 267 Pa.

By the same method as Example 1, the flatness of the devices after the above-mentioned CMP process and the barrier effect of the barrier layers to Cu were measured. Further, the composition of the layers and removal rates in CMP were measured. Table 2 shows a result. Examples 9–13 are examples according to the present invention and Examples 14–16 are comparative examples wherein the layer of Example 15 has the same composition as Example 7.

[Composition of Layer]

The composition of the layers was obtained by forming only a barrier layer of 300 nm on each Si substrate under the same condition and by conducting the quantitative analysis of element of the barrier layers by ESCA method.

[Polishing Rate]

The removal rate was obtained by measuring the layer thickness before and after the polishing on the basis of the sheet resistance of the barrier layers by using a four point probe method wherein the barrier layers were polished for 1 minute by CMP under the same condition as in planarizing the pattern.

TABLE 2

| Ex. | Composition of sputtering gas | | | Flatness | Barrier effect | Composition of $TaO_xN_y$ layer | | Polishing rate (nm/min) |
|---|---|---|---|---|---|---|---|---|
| | Ar | $CO_2$ | $N_2$ | | | x | y | |
| 9 | 95 | 1 | 4 | A | A | 0.02 | 0.04 | 200 |
| 10 | 90 | 5 | 5 | A | A | 0.08 | 0.04 | 200 |
| 11 | 85 | 5 | 10 | A | A | 0.08 | 0.08 | 190 |
| 12 | 80 | 10 | 10 | A | A | 0.15 | 0.08 | 190 |
| 13 | 50 | 10 | 40 | A | A | 0.15 | 0.4 | 180 |
| 14 | 80 | 0 | 20 | B | A | 0 | 0.2 | 150 |
| 15 | 0 | 0 | 100 | C | A | 0 | 0.85 | 140 |
| 16 | 100 | 0 | 0 | C | A | 0 | 0 | 30 |

As described above, an integrated circuit device having a high barrier effect and a high flatness without dishing in planarizing it can be produced at a sufficient processing rate by using the barrier layer of the present invention.

EXAMPLES 17–47

Integrated circuit devices having a damascened wiring of Cu were produced in the same manner as in Examples 1–8 except that the compositions as in Table 2 were used for sputtering gas for forming each barrier layer 3. As the target, metal comprising M shown in Table 3 or Table 4 and Ta was used. As the sputtering gas, argon, oxygen and nitrogen were used with compositional formulation (volume %) shown in Table 3 or Table 4. The sputtering gas pressure is 267 Pa.

On the integrated circuit devices thus obtained, the flatness of the devices after the above-mentioned CMP process and the barrier effect of the barrier layers to Cu were measured by the same method as in Examples 1–8. Table 3 and Table 4 show results. The composition of the added element M in each of the barrier layers is a value obtained by measuring a barrier layer produced previously under the same condition by a fluorescent X-ray method.

In Examples 17–46, barrier layers represented by compositional formula 2 were formed. Example 47 is the same as Example 14 and is comparative example. In the column of composition in Table 3 and Table 4, a value in proportion is a value corresponding to $(a/(1-a)) \times 100$ of a in the compositional formula 2, and it indicates the number of atoms of M to 100 atoms of Ta.

TABLE 3

| Ex. | Composition | | Composition of sputtering gas | | | Flatness | Barrier effect |
|---|---|---|---|---|---|---|---|
| | M | Proportion | Ar | Oxygen | Nitrogen | | |
| 17 | Al | 0.01 | 20 | 20 | 60 | B | A |
| 18 | Al | 0.1 | 20 | 20 | 60 | A | A |
| 19 | Al | 10 | 20 | 20 | 60 | A | A |
| 20 | Al | 100 | 20 | 20 | 60 | A | A |
| 21 | Al | 1000 | 20 | 20 | 60 | A | B |
| 22 | Ti | 0.01 | 20 | 20 | 60 | B | A |
| 23 | Ti | 0.1 | 20 | 20 | 60 | A | A |
| 24 | Ti | 10 | 20 | 20 | 60 | A | A |
| 25 | Ti | 100 | 20 | 20 | 60 | A | A |
| 26 | Ti | 1000 | 20 | 20 | 60 | A | B |
| 27 | Si | 0.01 | 20 | 20 | 60 | B | A |
| 28 | Si | 0.1 | 20 | 20 | 60 | A | A |
| 29 | Si | 10 | 20 | 20 | 60 | A | A |
| 30 | Si | 100 | 20 | 20 | 60 | A | A |
| 31 | Si | 1000 | 20 | 20 | 60 | A | B |

TABLE 3

| Ex. | Composition M | Proportion | Composition of sputtering gas Ar | Oxygen | Nitrogen | Flatness | Barrier effect |
|---|---|---|---|---|---|---|---|
| 32 | W | 0.01 | 20 | 20 | 60 | B | A |
| 33 | W | 0.1 | 20 | 20 | 60 | A | A |
| 34 | W | 10 | 20 | 20 | 60 | A | A |
| 35 | W | 100 | 20 | 20 | 60 | A | A |
| 36 | W | 1000 | 20 | 20 | 60 | A | B |
| 37 | Mo | 0.01 | 20 | 20 | 60 | B | A |
| 38 | Mo | 0.1 | 20 | 20 | 60 | A | A |
| 39 | Mo | 10 | 20 | 20 | 60 | A | A |
| 40 | Mo | 100 | 20 | 20 | 60 | A | A |
| 41 | Mo | 1000 | 20 | 20 | 60 | A | B |
| 42 | Zn | 0.01 | 20 | 20 | 60 | B | A |
| 43 | Zn | 0.1 | 20 | 20 | 60 | A | A |
| 44 | Zn | 10 | 20 | 20 | 60 | A | A |
| 45 | Zn | 100 | 20 | 20 | 60 | A | A |
| 46 | Zn | 1000 | 20 | 20 | 60 | A | B |
| 47 | nil | — | 20 | 0 | 80 | B | A |

INDUSTRIAL APPLICABILITY

The barrier layer of the integrated circuit device of the present invention has a barrier effect to Cu and permits a CMP process at a high throughput rate with high accuracy as well as providing a high flatness and uniformity. Accordingly, further microfabrication of the integrated circuit device using the Cu wiring becomes possible whereby the integrated circuit device satisfying a demand of high response speed can be produced.

What is claimed is:

1. A process for producing an integrated circuit device, wherein the following steps A to E are conducted in the following order:

(A) a step of forming a dielectric layer on a Si substrate, (B) a step of forming a groove in the dielectric layer, (C) a step of forming a barrier layer on the dielectric layer by sputtering in the presence of a gas comprising oxygen and nitrogen, using a target comprising Ta, or Ta and M, wherein M is at least one member selected from the group consisting of Groups 3, 4, 6, 7, 8, 9, 10, 12, 13 and 14 of the long form of the Periodic Table, (D) a step of forming a Cu wiring layer on the barrier layer, and (E) a step of removing the barrier layer to form a Cu wiring pattern.

2. An integrated circuit device having a Cu wiring layer, a barrier layer therefor and a dielectric layer, wherein the barrier layer is represented by the formula: $TaO_xN_y$, wherein $0.1 \leq x < 0.2$ and $0.3 \leq y < 0.5$.

3. An integrated circuit device having a Cu wiring layer, a barrier layer therefor and a dielectric layer, wherein the barrier layer is represented by the formula: $Ta_{1-a}M_aO_bN_c$ wherein M is at least one element selected from the group consisting of elements of Groups 3, 4, 6, 7, 8, 9, 10, 12, 13 and 14 of the long form of the Periodic Table and wherein $0 < a < 1$, $0.001 \leq b < 0.2$ and $0.001 \leq c < 0.5$.

4. The integrated circuit device according to claim 3, wherein $0.001 \leq b < 0.1$ and $0.001 \leq c < 0.3$.

5. The integrated circuit device according to claim 3, wherein M is at least one member selected from the group consisting of Al, Ti, Si, W, Mo and Zn.

6. The integrated circuit device according to claim 3, wherein $0.001 \leq a < 0.9$.

7. A method for producing an integrated circuit device having a Cu wiring layer, a barrier layer therefor and a dielectric layer, which comprises:

forming a barrier layer by sputtering against a Ta target in a gas phase comprising oxygen or carbon dioxide and nitrogen on a dielectric layer, the barrier layer which is formed having a composition of the formula: $TaO_xN_y$, wherein $0.1 \leq x < 0.2$ and $0.3 \leq y < 0.5$.

8. A method for producing an integrated circuit device having a Cu wiring layer, a barrier layer therefor and a dielectric layer, which comprises:

forming a barrier layer by sputtering against a target comprising Ta and element M in a gas phase comprising oxygen or carbon dioxide and nitrogen on a dielectric layer, the barrier layer which is formed having a composition of the formula: $Ta_{1-a}M_aO_bN_c$, wherein M is at least one member selected from the group consisting of elements of Groups 3, 4, 6, 7, 8, 9, 10, 12, 13 and 14 of the long form of the Periodic Table, $0 < a < 1$, $0.001 \leq b < 0.2$ and $0.001 \leq c < 0.5$.

* * * * *